(12) United States Patent
Graur et al.

(10) Patent No.: US 7,624,369 B2
(45) Date of Patent: Nov. 24, 2009

(54) CLOSED-LOOP DESIGN FOR MANUFACTURABILITY PROCESS

(75) Inventors: Ioana Graur, Poughkeepsie, NY (US); Geng Han, Beacon, NY (US); Scott M. Mansfield, Hopewell Junction, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 11/554,904

(22) Filed: Oct. 31, 2006

(65) Prior Publication Data

US 2008/0127029 A1 May 29, 2008

(51) Int. Cl.
*G06F 17/50* (2006.01)
(52) U.S. Cl. ...................................................... 716/19
(58) Field of Classification Search ................... 716/19
See application file for complete search history.

(56) References Cited

U.S. PATENT DOCUMENTS

| | | | |
|---|---|---|---|
| 6,578,190 B2 | 6/2003 | Ferguson et al. | |
| 7,043,712 B2* | 5/2006 | Mukherjee et al. | 716/19 |
| 7,100,134 B2 | 8/2006 | Wu et al. | |
| 7,175,940 B2* | 2/2007 | Laidig et al. | 430/5 |
| 7,342,646 B2* | 3/2008 | Shi et al. | 355/77 |
| 2003/0229881 A1 | 12/2003 | White et al. | |
| 2005/0114822 A1 | 5/2005 | Axelrad et al. | |
| 2005/0223350 A1 | 10/2005 | Zhang et al. | |
| 2005/0229130 A1 | 10/2005 | Wu et al. | |
| 2006/0236271 A1 | 10/2006 | Zach | |

OTHER PUBLICATIONS

U.S. Appl. No. 11/163,264, Title: "Designer's Intent Tolerance Bands For Proximity Correction And Checking", Date Filed Oct. 12, 2005, Applicant(s): Scott M. Mansfield, et al.
U.S. Appl. No. 11/138,172, Title: "Optical Proximity Correction Using Progressively Smoothed Mask Shapes", Date Filed May 26, 2005, Applicant(s): Maharaj Mukherjee, et al.
Philippe Hurat, et al.—"DFM for Manufacturers and Designers"—25th Annual BACUS Symposium on Photomask Technology, Proc. of SPIE vol. 5992, (2005) pp. 59920G-1 thru 59920G-7.

* cited by examiner

*Primary Examiner*—Jack Chiang
*Assistant Examiner*—Brandon W Bowers
(74) *Attorney, Agent, or Firm*—Steven Capella

(57) ABSTRACT

A method of designing an integrated circuit is provided in which the design layout is optimized using a process model until the design constraints are satisfied by the image contours simulated by the process model. The process model used in the design phase need not be as accurate as the lithographic model used in preparing the lithographic mask layout during data prep. The resulting image contours are then included with the modified, optimized design layout to the data prep process, in which the mask layout is optimized using the lithographic process model, for example, including RET and OPC. The mask layout optimization matches the images simulated by the lithographic process model with the image contours generated during the design phase, which ensures that the design and manufacturability constraints specified by the designer are satisfied by the optimized mask layout.

21 Claims, 8 Drawing Sheets

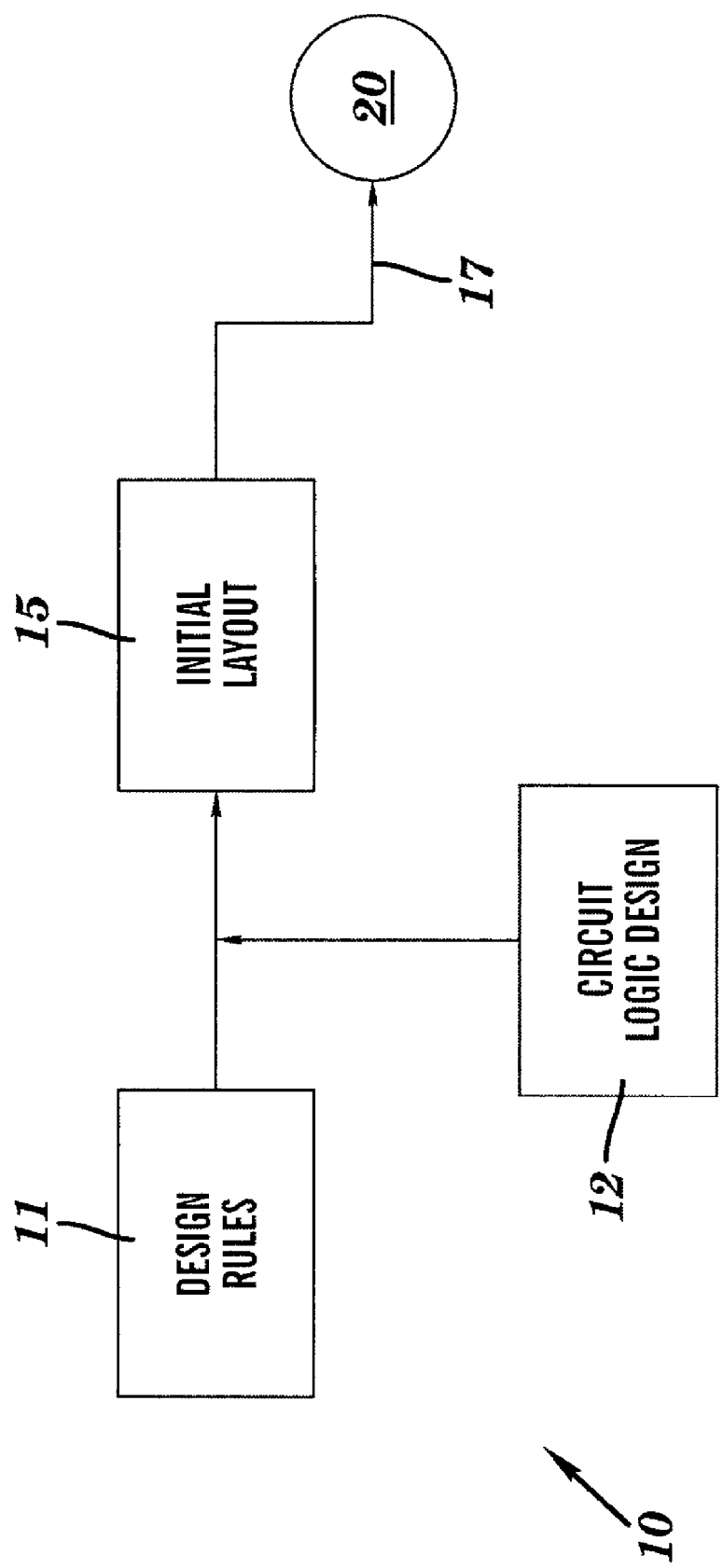
FIG. 1A.
_PRIOR ART_

CLOSED-LOOP DESIGN FOR MANUFACTURABILITY PROCESS

FIELD OF THE INVENTION

The present invention relates to the manufacture of integrated circuits and to lithographic methods for manufacturing integrated circuit on a wafer. More particularly, the present invention relates to the design and manufacture of lithographic masks for the manufacture of integrated circuits and a method for optimizing the mask design for manufacturability.

BACKGROUND OF THE INVENTION

Integrated circuits are typically fabricated by optical lithographic techniques, where energy beams transmit integrated circuit images or patterns on photomasks (equivalently, masks or reticles) to photosensitive resists on semiconductor wafer substrates, formed (equivalently, printed or transferred) as multiple layers of patterned materials overlain on the substrate. For each patterned layer formed on the substrate, there may be one or more masks used to form the printed patterns on the wafer. The patterns are typically expressed as polygons on the masks. However, the polygons of the mask transferred to or imaged on the wafer will be smoothed and distorted during the lithographic process of transferring the mask patterns to the wafer, due to a variety of optical effects, as is well-known in the art. Thus, it is desirable that the circuit designers take into account the characteristics of the lithographic process, as well as functional and performance requirements, while designing the circuit layout.

The process of manufacturing an integrated circuit using a lithographic process can be generally understood with reference to FIGS. 1A-1C.

Referring to FIG. 1A, during a circuit design process flow 10, a circuit designer will incorporate a set of design rules 11 for preparing polygons for the initial mask layout 15 that correspond to a desired circuit layout level. The rules 11 may be expressed as, for example, as look-up tables of two-dimensional criteria, and may include criteria related to requirements such as overlay tolerance, critical dimension (CD), minimum and maximum spacing between polygon shapes, etc. Optionally, the rules may be expressed in terms of tolerance bands around the desired design shapes. The designer will combine the requirements of the circuit logic 12 with the design rules 11, to arrive at an initial circuit layout 15, which typically comprises a two-dimensional layout of polygon shapes. Design rules 11 typically include tolerances and constraints and other criteria related to performance and electrical characteristics of circuit devices, as well as manufacturability rules, such as, for example, related to lithographic processes and overlay tolerances. An initial mask layout is typically assigned the same polygon layout as provided by the circuit layout 15. Typically, the initial mask layout 15 is written out as a data set which will be provided as input to the lithographers, for example, at the foundry or FAB. The process of writing out the mask layout data set is often referred to as tapeout 17, and the tapeout data set may be sent to the foundry as input to further analysis and modification 20 by the foundry lithographic engineers.

The circuit image on the photomask may not be reproduced precisely on the substrate, in part because of optical effects among transmitted and blocked energy passing through the photomask. Referring to FIG. 1B, prior to manufacturing the mask, the initial design layout 15 is typically modified to account for such optical effects. The process 20 of modifying the initial mask design 15 to form an actual, modified, mask layout 25 may include modifications by optical proximity correction (OPC) 29 and may optionally include resolution enhancement techniques (RET) 27. The process of modifying the mask layout is commonly referred to as data preparation (equivalently, "Data-Prep") 20. Optical Proximity Correction (OPC) 29 has been employed as a key enabling resolution enhancement technique required to meet image size control requirements imposed by state-of-the-art integrated circuit product programs. OPC 29 is essentially the deliberate and proactive distortion of photomask patterns to compensate for systematic and stable errors. OPC is generally categorized as either rules-based or model-based. Rules-based OPC is done by determining the correctable imaging errors, calculating appropriate photomask compensations, and finally applying the calculated corrections directly to the photomask layout.

Model-based OPC (MBOPC) is based on the concept of capturing the imaging characteristics in a mathematical model 21 that represents the lithographic process, and calculating the expected on-wafer circuit image which would be projected by the mask pattern under investigation, comparing the simulated image contour placement to the edge placement of the original mask pattern and iteratively adjusting the mask patterns until a suitable match of the simulated image to the desired on-wafer target pattern 23, within specified tolerances and other mask layout rules 24, is obtained. The mask layout rules 24 may include manufacturability rules that relate to mask house requirements, which would typically not be applied during the design of the circuit layout (e.g. FIG. 1A). Note that typically, the on-wafer target pattern 23 has the same layout of polygons as the initial design layout 15, which represents what the designer intends to be printed on the wafer. While MBOPC results in greater fidelity in the printed image, the use of MBOPC requires significantly more computational resource than rules-based OPC.

Existing optical lithographic tools currently employ laser illumination at 193 nm wavelengths. For a given wavelength of illumination energy, the resolution of the lithographic process, or, in other words, the smallest dimension $\rho$ that can be reliably imaged, is typically expressed by the Rayleigh scaling equation:

$$\rho = \frac{k\lambda}{NA},$$

where $\lambda$ is the wavelength of the source light, NA (numerical aperture) is a measure of the amount of light that can be collected by the lens, and the so-called k-factor k represents aspects of the lithographic process other than wavelength or numerical aperture, such as resist properties or the use of enhanced masks. Typical k-factor values range from about 0.7 to 0.4. However, by using a variety of resolution enhancement technologies (RETs) such as sub-resolution assist features (SRAFs), alternating phase-shift masks (altPSM), the k-factor may be reduced to improve the resolution of the lithographic process. When RET is used along with and in addition to MBOPC, existing optical lithographic tools are being used to print ever smaller feature sizes, from 90 nm to 45 nm or smaller.

Model-based OPC, along with RET, as practiced today typically involves five primary polygon data sets:

an initial mask layout 15, which is used as input to MBOPC, which typically includes a polygon rendering of the circuit design 15 as laid out by the designers;

a RET layout, which is the initial input mask layout modified for resolution enhancement techniques (RET) such as assist features or alternating phase shapes;

a wafer target 23, which describes the desired on-wafer polygons, i.e. what is needed on the wafer to get the desired yield. Typically, the wafer target 23 is equivalent in layout to the initial mask or circuit design layout 15;

simulated contours, which are the predicted on-wafer polygons generated by convolving the mask layout with a mathematical model of the imaging process; and the modified or interim mask layout 25, which is the output of an OPC iteration that describes the polygons to be placed on the photomask.

Model-based OPC is an iterative optimization process that involves:

generating simulated contours of the initial mask layout 15, typically modified to form a RET layout;

comparing the simulated contours to the wafer target 23;

adjusting the RET layout to compensate for offsets between the simulated contour and the wafer target 23—thereby generating the first estimate of the mask layout 25; and repeating this process using the interim mask layout 25 from one iteration as the input for the next iteration.

This cycle is repeated until the offset between the simulated contour and the wafer target 23 is at an acceptable value, or until a maximum number of iterations is exhausted. The output of the final iteration becomes the actual mask layout 25 which is sent to the maskhouse.

A commonly applied simplification is that the initial input mask layout 15 is assumed to be equal to the wafer target 23.

The modified mask layout 25 may then be sent to a mask house and/or to the foundry or FAB, for fabrication. However, referring to FIG. 1C, before the mask is built, the modified mask layout 25 typically undergoes a further verification procedure 30, which verifies the mask manufacturability according to the requirements and capabilities of the mask house, and printability of the mask based on the detailed lithographic process of the specific FAB where the integrated circuit will be manufactured. The mask is checked for errors (Block 31) according to manufacturability and printability criteria that may be provided in a variety of forms, such as a detailed process model 33 and manufacturability and/or printability rules 34 provided by the FAB, and/or the mask house. The modified mask layout 25 is examined 31 for violations of the rules or for printability errors that may unacceptably increase the risk of yield failures for the specific lithographic process to be used. If the modified mask 25 passes the printability and manufacturability criteria (i.e., no errors are found in Block 37), then the mask may be built (Block 35). However, if mask errors are found, then the mask may have to be further modified as in the data prep procedure 20 of FIG. 1B, or possibly re-designed, as in procedure 10 of FIG. 1A.

More recently, it has been proposed that the mask layout be designed to ensure manufacturability and printability at the design stage. Referring to FIG. 2, this procedure, so-called design for manufacturing (DfM) 40, is a modification of the basic design flow 10 of FIG. 1A. Design rules 11 and circuit logic 12 are provided as input, as in a basic design flow 10 (see FIG. 1A), but the resulting mask layout 42, which may include RET shapes, is modified by a model-based layout optimization procedure 140. The model-based modification 140 takes as input a wafer target 43, along with specified tolerances and mask layout rules 41, and, using an initial process model 44, involves simulating an image 47 using the process model 44. As discussed above, the wafer target 43 is often has the same polygon layout as the initial circuit or mask design layout 15. The simulated contours are presented to the designers, thereby enabling them to adjust their layout shapes to obtain more favorable wafer shapes. This may be done, for example, by applying the RET to the layout 42 at hand, running OPC, and then using a process window model 44 (i.e. a model aware of process variations) to generate contour bands to present to the designer. Alternatively, the process model 44 may comprise a compact model which, with reasonable accuracy, describes the entire sequence of shape transforms from input layout, RET layout, mask layout, to simulated contour band. In most cases, the generated contours are evaluated for dimensional failures, i.e. layout verification 49, similar to the mask verification 30 (FIG. 1C), and error markers are presented to the designers to prompt a layout modification. If no errors are found (no errors in Block 48), then tapeout 45 of the modified layout may be performed and the dataset comprising the modified layout is then sent forward to the foundry and enters the data prep cycle 20 (FIG. 1B) as the input, initial mask layout 15 (FIG. 1B). Thus, desirably, the output of model-based layout optimization 140 that is sent to the foundry's RET/OPC analysis 20 should be exhibit fewer or no printability or manufacturability errors.

However, there are several drawbacks to this approach.

First, the development of lithographic and wafer etch processes and chip designs typically occurs concurrently over periods from about 6 months at minimum to 5 years or more. This development time frame makes it practically impossible to give designers accurate descriptions of the RET and OPC solutions as well as accurate process window models during the design of the chip. Having designers optimize layouts to inaccurate models and RET/OPC solutions while they are operating under the assumption that they have accurate insight into the patterning process can lead to catastrophic failures and would make manufacturability worst, not better.

Secondly, the primary customers for model-based layout optimization are fabless design houses which design chips to be manufactured at outside foundries. A key requirement for these fabless design houses is to maintain foundry portability (i.e. the ability to move their business from one foundry to a competing one) or even to outsource their product to multiple foundries at the same time. The success of model-based layout optimization is based on a detailed, accurate model of a particular foundry's RET/OPC and imaging solution, and thus fundamentally links the optimized layout to a specific foundry. Thus, performing a model-based layout optimization using the detailed process model for each individual foundry would be impractical. An alternative solution of using a 'least common denominator' model that describes the worst case printability failures for multiple foundries would be extremely conservative and would yield noncompetitive layout densities, which is of particular importance for multiple foundries collaborating or competing for fabless business.

Thirdly, when a designer manipulates the original layout based on simulation feedback, he/she is effectively introducing a new polygon set, i.e. the optimized layout no longer represents the original designer's intent, it represents what the designer had to do to the original intended layout to make it pass the model-based optimization. If this manipulated layout is introduced as the input layout to the RET/OPC flow the added polygon complexity and uncertainty over designer's intent, will introduce manufacturability risk and could have the exact opposite effect of what DfM is intending to achieve.

Modifications of OPC applications have been proposed that try to account for normal and unavoidable process variations by replacing the wafer target with a wafer target band and by replacing the simulated contours with simulated contour bands. The iterative optimization process remains the same, but the wafer target bands need to be generated either by the designer based on an understanding of shape tolerances required for circuit yield, or by the OPC tool from the input layout by applying tolerances communicated in the design rule manual. Such modifications to OPC have been termed process window OPC (PWOPC), and PWOPC has been proposed as a key component of a strategic design for manufacturability (DfM) solution.

However, implementation of PWOPC with DfM has the following difficulties: First, wafer target bands generated by the designer are completely unaware of the available process capability, i.e. the designers know what they would like, but can't tell what is reasonable to ask for in all layout situations. Secondly, wafer target bands generated by the OPC application are unaware of designer's needs, i.e. at this point, the process limitations are well known, but acceptable tolerances are not. Thirdly, the generation of the wafer target bands in either case is rules-based, i.e. a series of sizing operations and Booleans is performed to generate rectilinear approximations to the desired wafer target bands. Challenges in reliably manipulating layouts through complex rule sets drove the implementation of model-based OPC in the first place, and reestablishing a dependence on such rules-based operations would effectively be taking a step backwards and would introduce significant yield risk.

In view of the above, there is a need for a design for manufacturing solution that avoids the aforementioned difficulties, and provides a mask design that minimizes or avoids printability and/or manufacturability errors during mask verification at multiple foundries, and provides an efficient design process that is suitable for fab-less designs.

SUMMARY OF THE INVENTION

Bearing in mind the problems and deficiencies of the prior art, it is therefore an object of the present invention to provide an improved method to design and manufacture lithographic masks for integrated circuits.

It is another object of the present invention to provide a method of ensuring that the designer's constraints are satisfied during the mask optimization phase.

A further object of the invention is to provide a data preparation methodology that will meet the design rules and not require a redesign of the layout after mask verification.

It is yet another object of the invention to provide a more efficient mask design process that ensure manufacturability that may be optimized for mask houses, without having to customize the design.

The invention provides a method of designing an integrated circuit is provided in which the design layout is optimized using a process model until the design constraints are satisfied by the image contours simulated by the process model. The process model used in the design phase need not be as accurate as the lithographic model used in preparing the lithographic mask layout during data prep. The resulting image contours are then included with the modified, optimized design layout to the data prep process, in which the mask layout is optimized using the lithographic process model, for example, including RET and OPC. The mask layout optimization matches the images simulated by the lithographic process model with the image contours generated during the design phase, which ensures that the design and manufacturability constraints specified by the designer are satisfied by the optimized mask layout.

According to one aspect of the invention, a method is provided for designing an integrated circuit, the method comprising the steps of:
providing one or more design tolerances;
providing a layout;
providing a first process model;
modifying the layout to form a first modified layout so that first image contours satisfy the one or more design tolerances, wherein the first image contours correspond to the first modified layout as determined using the first process model;
providing a second process model; and
modifying the first modified layout to form a second modified layout so that second image contours substantially match the first image contours, wherein the second image contours correspond to the second modified layout as determined by the second process model.

Preferably, process window models are used to determine the image contours, and bands of contours are preferably used as target input to mask layout optimization, such as MBOPC.

According to another aspect of the invention, the method may be embodied in a computer system, or in a computer program product.

According to yet another aspect of the invention, a method according to the invention may be provided as a service to a designer, such as a fabless design house.

Still other objects and advantages of the invention will in part be obvious and will in part be apparent from the specification.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A illustrates a prior art design flow.

DETAILED DESCRIPTION OF THE INVENTION

The present invention will now be described in greater detail by referring to the following discussion with reference to the drawings that accompany the present application. It is observed that the drawings of the present application are provided for illustrative purposes and thus they are not drawn to scale.

Figure 3:
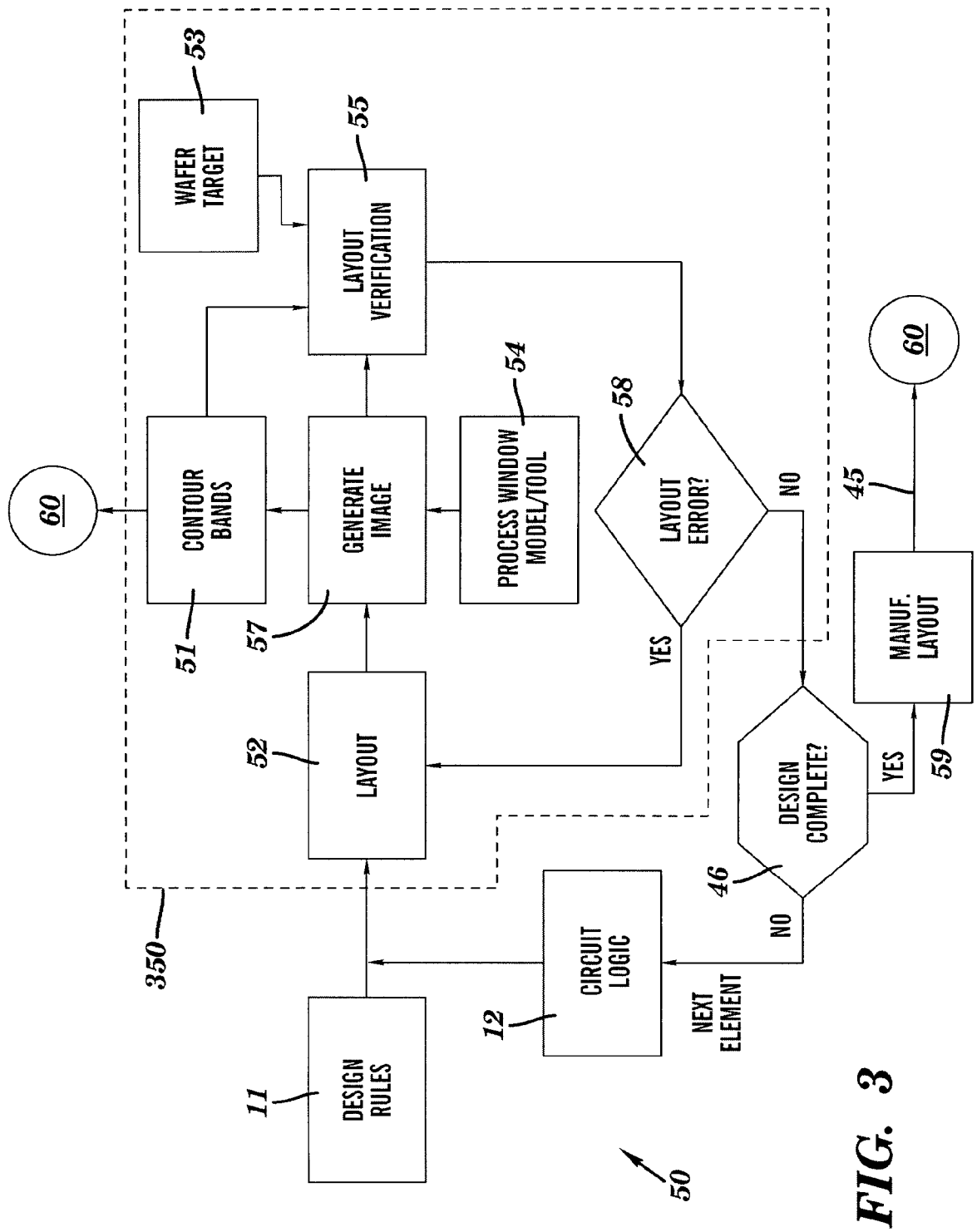
FIG. 3 illustrates a preferred embodiment of a layout optimization methodology in a DfM process in accordance with the invention.

Referring to FIG. 3, one embodiment of the present invention includes, during a design phase 50 of a circuit layout, circuit logic 12 and design rules 11 are provided and used by a designer, typically with the aid of a variety of software tools (not shown for clarity), to arrive at an initial circuit layout 52. In accordance with the present invention, a layout optimization 350 is performed on the layout 52, or a portion or element of the layout 52, during the design phase which uses a lithographic process model/tool 54, preferably a process window model/tool. The process window model/tool 54 may be similar to a model used by a foundry or fab for OPC. The process window model/tool 54 may optionally include tools, such as RET and OPC tools, to assist the designer in modifying the shapes. Process window models have been described, for example, in co-assigned U.S. Pat. No. 6,578,190, the disclosure of which is hereby incorporated by reference. Preferably, the model 54 is a compact (that is, faster than a detailed lithographic process model used for OPC) model, but is sufficiently accurate and representative of the expected lithographic process that it will meet and preferably exceed the designer's design rules.

In accordance with the present invention, the process window model 54 is used to generate an image 57, and more particularly, image contours 51 which simulate the printed image on the wafer. Image contours 51 may be determined by any method known in the art, or developed in the future, for example, by determining the intersection of a resist threshold model with the simulated image intensity. Preferably, bands of contours 51 are determined that are expected to be printed with a certain degree of confidence (e.g. ±3σ) over a range of process conditions likely to be used. The generated image 57 and contour bands 51 are verified (Block 55) by comparing the image 57 and contours or contour bands 51 to the wafer target 53 and ensuring a match, within the provided tolerances. If there are layout printability or manufacturability errors (Block 58), i.e., if the tolerances are violated, then the layout is modified by the designer until the deviations between simulated contours or bands 51 and the wafer target 53 satisfy, or equivalently, are within tolerances, and the layout or the relevant portion thereof then passes verification 55. This is repeated for each portion or element of the layout 52 until the design is complete (Block 46). When the design is complete the layout 59, which, by virtue of the verification 55 is optimized for manufacturability, is then provided (e.g. tapeout 45) to the foundry for data prep 60, according to an embodiment of the invention discussed further below. Note that in accordance with the invention, the contour bands 51 provided by the process window model 54 are also provided to the inventive data prep 60.

Figure 1B:
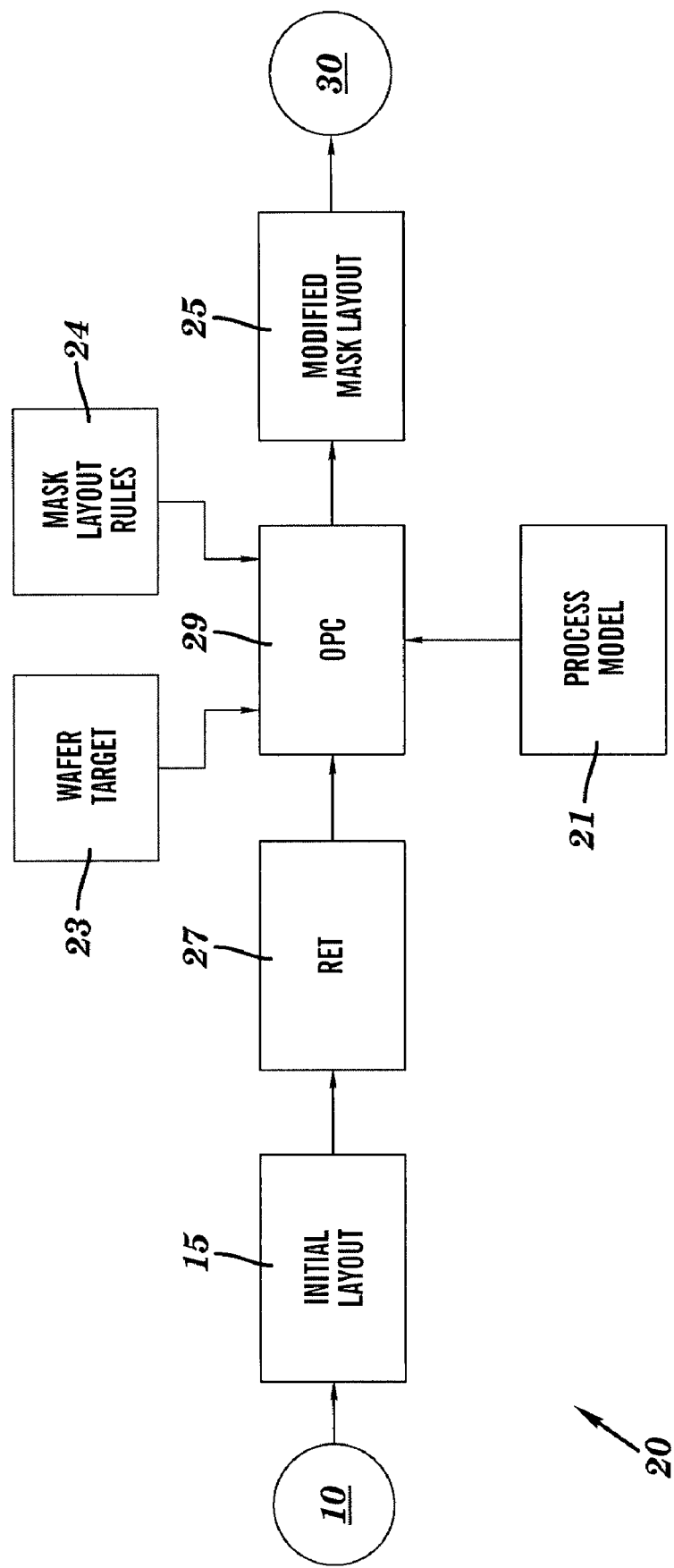
FIG. 1B illustrates a flow chart of a prior art data prep process.
Figure 1C:
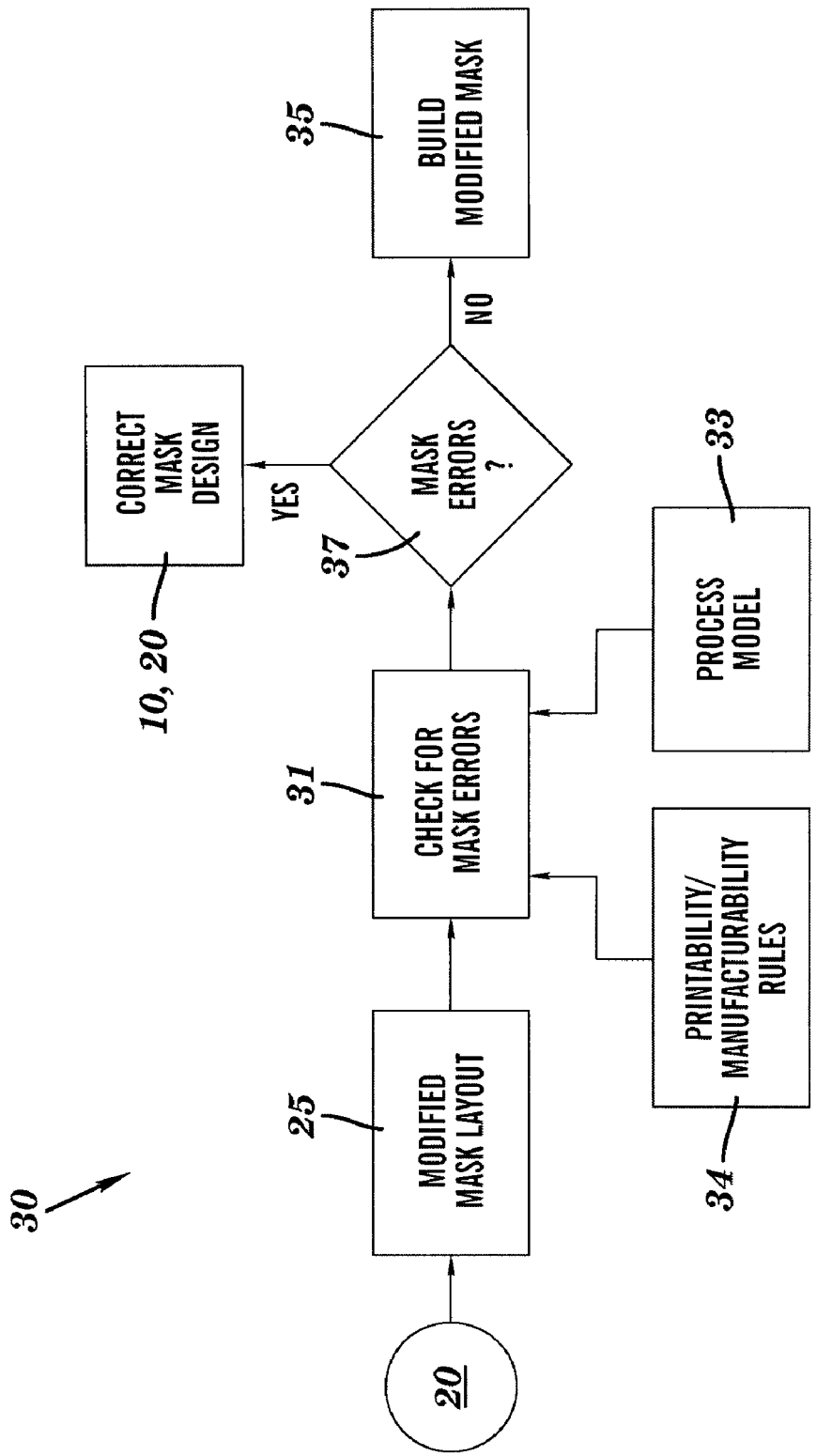
FIG. 1C illustrates a flow chart of a prior art mask verification process.
Figure 2:
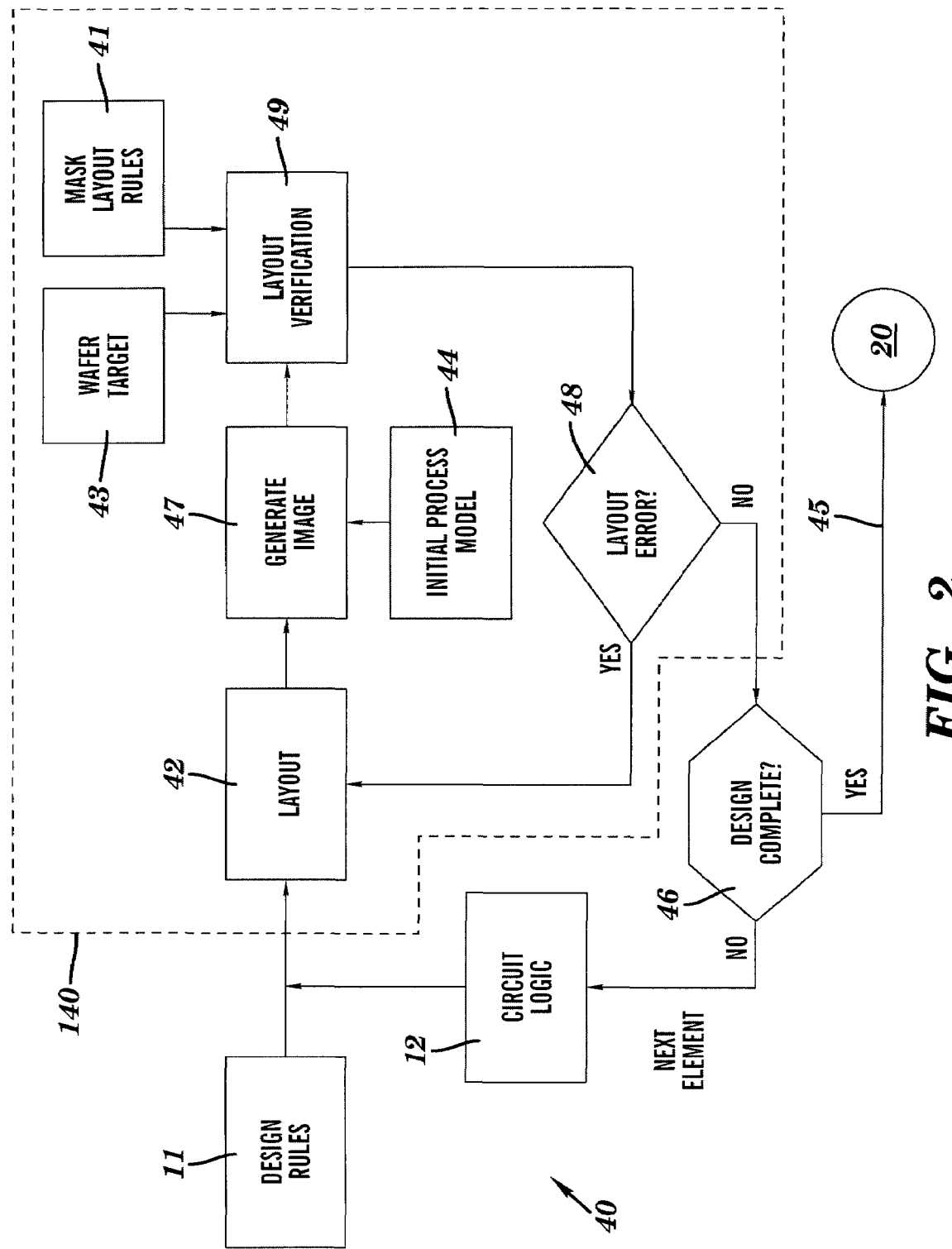
FIG. 2 illustrates a proposed DfM flow.
Figure 7C:
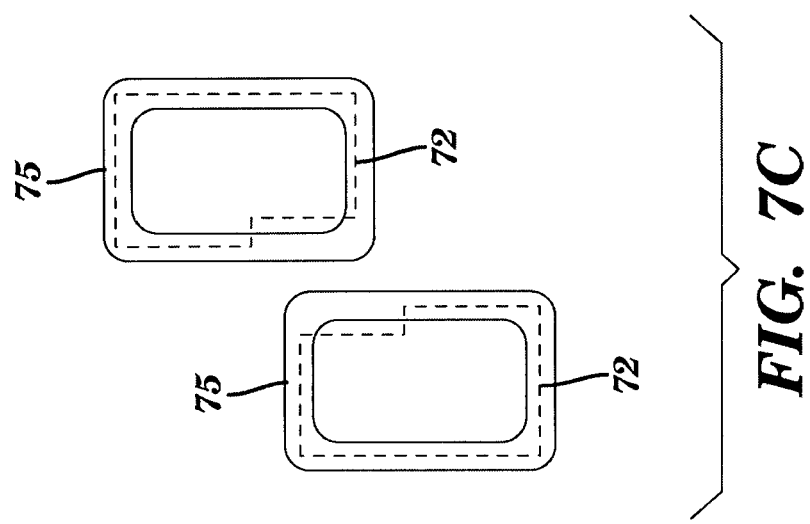
FIG. 7C illustrates contour bands generated during a layout optimization phase, according to an embodiment of the invention.
Figure 7B:
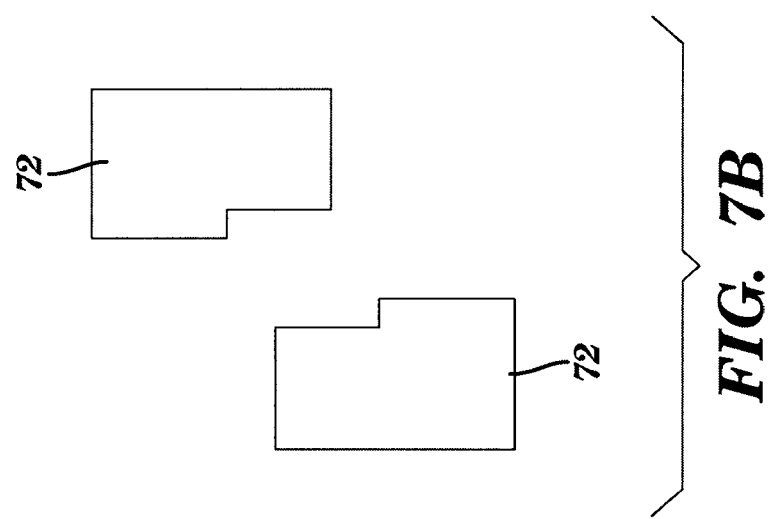
FIG. 7B illustrates modified layout shapes during a design phase of a DfM process.
Figure 7A:
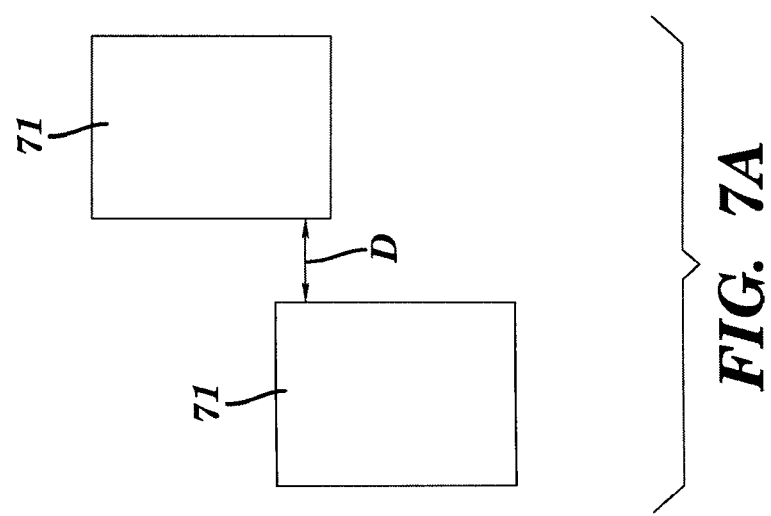
FIG. 7A illustrates layout shapes during a design phase of a DfM process.

By way of example, consider initial circuit shapes 71 illustrated in FIG. 7A. If the spacing D between the shapes is less than a predetermined minimum spacing, or if the simulated image using a mask based on the initial circuit shapes 71 otherwise violates rules of a process model/tool 54, the shapes may be modified by the designer, or by an automated tool, such as an OPC tool. The resulting shapes 72 illustrated in FIG. 7B now satisfy the design rules and/or the process model/tool 54. In prior art design processes, the resulting shapes 72 would then be provided to the foundry as input (i.e. in the initial layout 15 of FIG. 1B) to the data prep process 20 (FIG. 1B). Note that in prior art data prep 20, the wafer target 23 is set equal to the input layout 15, which the OPC tool will attempt to match, even though the target 23 would include the shapes 72 that no longer represent the designer's intended shapes 71. By contrast, in accordance with the invention, by using the process window model/tool 54, simulated contour bands 75 are generated by the process model/tool that satisfy the designer's rules and will meet the designer's tolerances over the range of expected process conditions. In accordance with the present invention, the contour bands 75, 51, which preserve the designer's intended shapes, within tolerances, are now provided to the inventive data prep process 60 as input targets 53 (FIG. 3).

Figure 4:
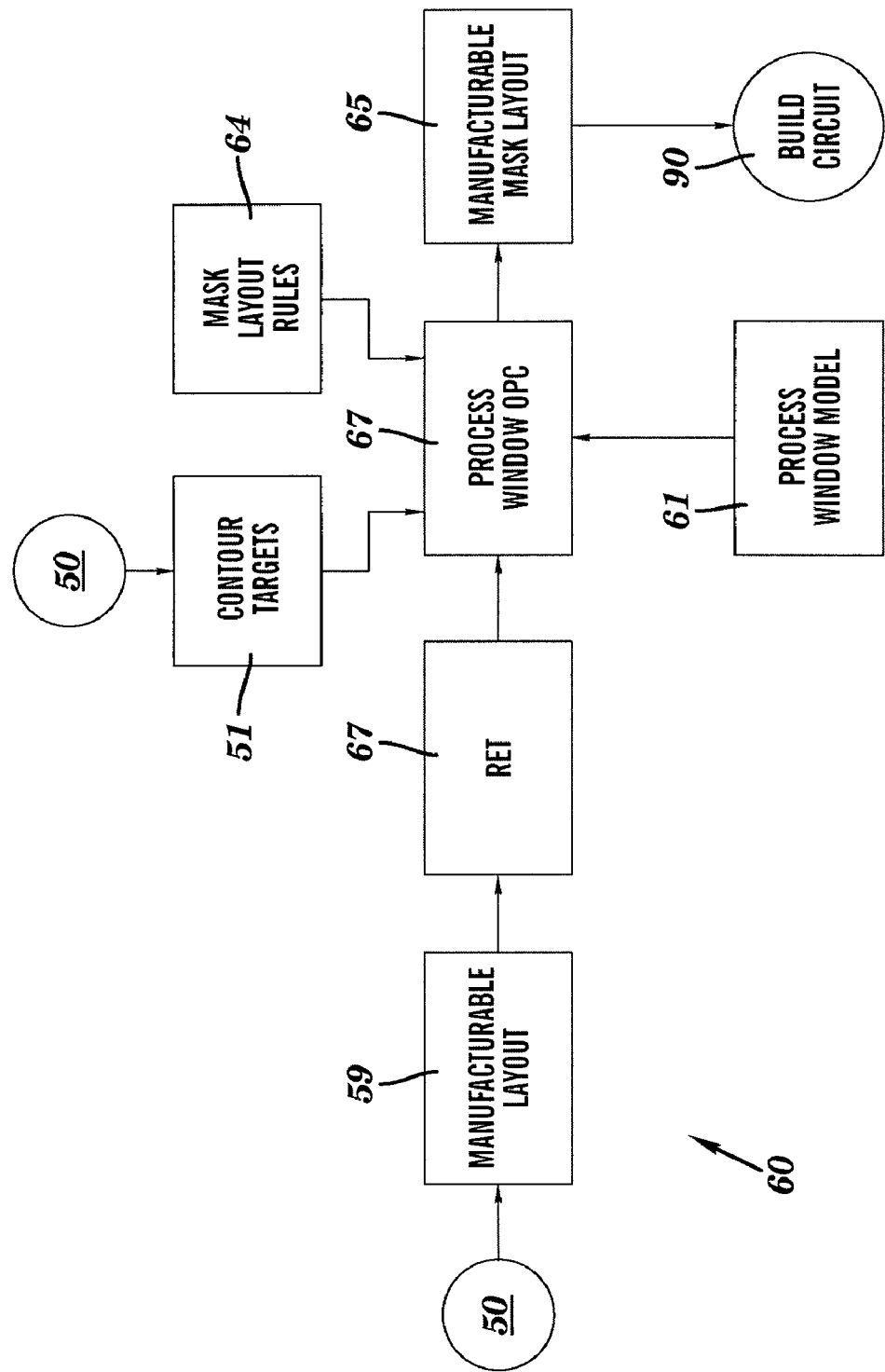
FIG. 4 illustrates a preferred embodiment of a data prep methodology in a DfM process in accordance with the invention.

Referring to FIG. 4, in accordance with the invention, the data prep 60 receives the resulting manufacturable layout 59, as input into a process window OPC tool 67, and optionally a RET layout tool 67. In addition, the contours or contour bands 51 generated during the design layout optimization 350 are provided as wafer target input 51 to the process window OPC 67. The process model 61 used in the inventive data prep 60 is expected to be more current and more accurate than the model 54 used during the design layout optimization 350. Preferably, the process model 61 is a process window model. The resulting mask layout 65 will be optimized for manufacturability without violating the designer's design rules, since the process window OPC 67 will optimized the mask layout to match the input contour target 51, i.e. the contours or contour bands 51, which have satisfied the designer's tolerances during the design optimization 350 (FIG. 3). If contours are provided as the target input 51, then the process window OPC 67 may be configured so that as to match the simulated contours generated by the current process window model 61 within tolerances and mask layout rules 64, which may include manufacturability rules from the mask house, which may not have been available during the design phase. Stated another way, the differences between the simulated contours and the target input 51 (which are the contours or bands determined during the layout optimization 350 in the design phase 50) must satisfy the tolerances. If contour bands are provided as the target input 51, then the process window OPC 67 may be configured so as to ensure that the simulated contours fall within (i.e. substantially match) the provided target bands 51. Optionally, modified tolerances, for example, including manufacturability tolerances, may be provided that allow the simulated contours to deviate from the target bands but still satisfy the modified tolerances.

A key advantage provided by the present invention is that the mask layout will at least satisfy the designer's design and manufacturability rules, and thus the layout will not need to be sent back to the designer, as opposed to the prior art methods. Thus, the present invention provides a methodology of closing the design loop for DfM. In addition, during data prep, the mask layout may be optimized according to individual mask house rules without requiring a customized design, and still satisfy the original design rules.

The resulting optimized mask layout 65 may then be used to manufacture the circuit (Block 90).

Figure 8:
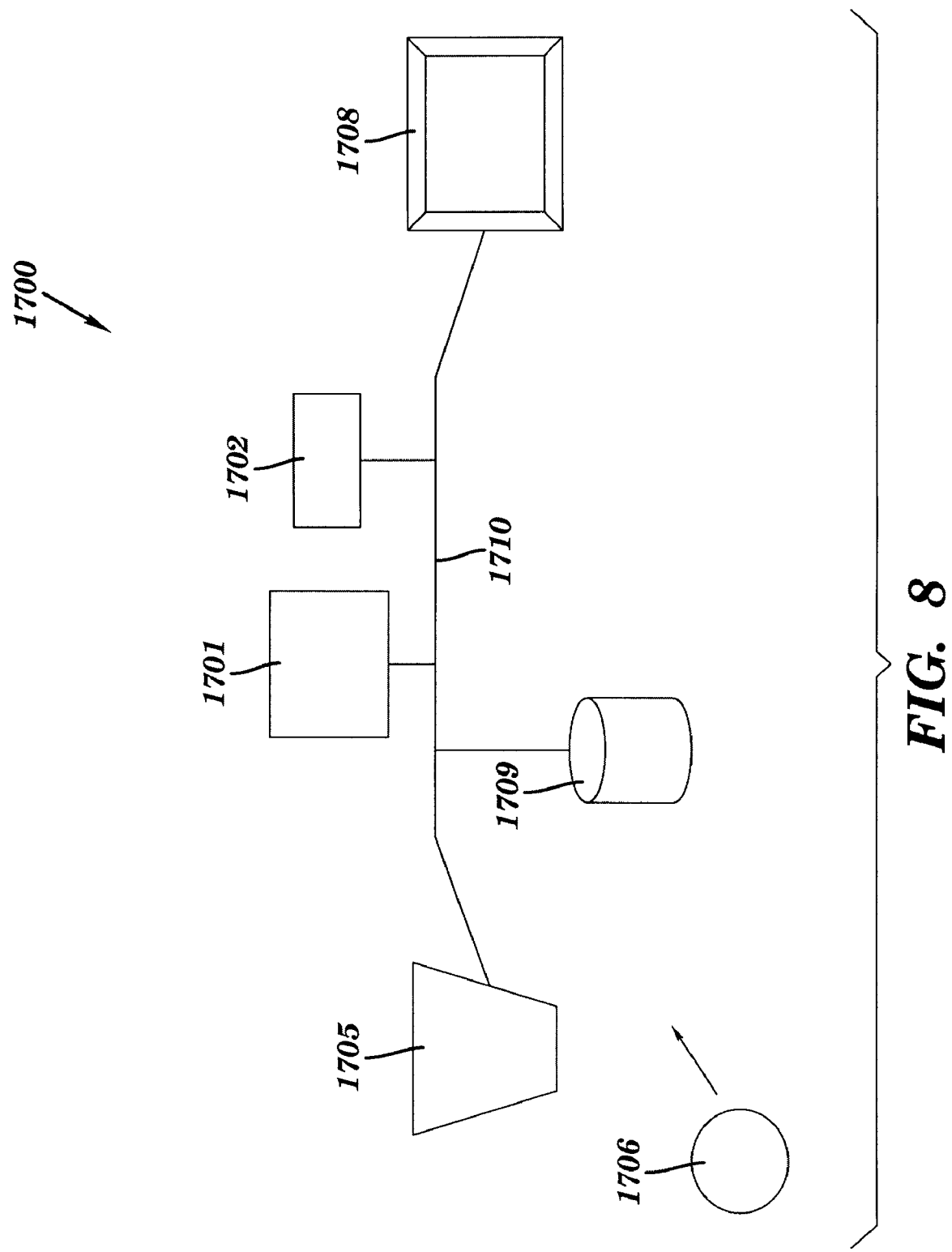
FIG. 8 illustrates a computer system and computer program product configured to perform embodiments of the inventive DfM process.

In one embodiment of the present invention, referring to FIG. 8, the layout optimization method 350 and data prep method 60 may be implemented in a digital computer 1700, having components including, but not limited to: a central processing unit (CPU) 1701, at least one input/output (I/O) device 1705 (such as a keyboard, a mouse, a compact disk (CD) drive, and the like), a display device 1708, a storage device 1709 capable of reading and/or writing computer readable code, and a memory 1702, all of which are connected, e.g., by a bus or a communications network 1710. The present invention may be implemented as a computer program product stored on a computer readable medium, such as a tape or CD 1706, which may be, for example, read by the I/O device 1705, and stored in the storage device 1709 and/or the memory 1702. The computer program product contains instructions to implement the method according to the present invention on a digital computer. The invention can take the form of an entirely hardware embodiment, and entirely software embodiment or an embodiment containing both hardware and software elements. In a preferred embodiment, the invention is implemented in software, which includes, but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus, device or element that can contain, store, communicate, propagate, or transport the program for use by or in connection with the computer or instruction execution system. The medium can be an electronic, magnetic, optical, electromagnetic, infrared, or semiconductor storage medium, network or propagation medium. Examples of a storage medium include a semiconductor memory, fixed storage disk, moveable floppy disk, magnetic tape, and an optical disk. Current examples of optical disks include compact disk-read only memory (CD-ROM), compact disk-read/write (CD-R/W) and digital video disk (DVD). The present invention may also be implemented in a plurality of such a computer or instruction execution system where the present items may reside in close physical proximity or distributed over a large geographic region and connected by a communications network, communicating through a propagation medium via communication devices, such as network adapters. Examples of a network include the Internet, intranet, and local area networks. Examples of a propagation medium include wires, optical fibers, and wireless transmissions. Examples of network adapters include modems, cable modems, ethernet cards and wireless routers.

In another embodiment of the present invention, the method according to the invention may be provided as a part of a DfM service, for example, providing a layout optimization service to a designer, by providing a compact process model, wherein the simulated results include contour bands that satisfy the designer's design criteria and tolerances (see FIG. 3). The resulting contour bands may used as target input in a data prep service, wherein a process window model is used in an RET/OPC process to provide a manufacturable mask layout (see FIG. 4).

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A computer implemented method for designing an integrated circuit, the method comprising the steps of:
   a) providing one or more design tolerances, a design layout containing a set of intended design shapes, and a first process model then
   b) using said design layout and said first process model to generate first image contours which simulate an image printed on a wafer;
   c) modifying said design layout by computer to form a modified design layout based on step (b);
   d) repeating steps (b) and (c) using said modified design layout until said first image contours satisfy said one or more design tolerances;
   then e) using said modified design layout and a second process model, different from the first process model and which corrects for optical proximity, to generate a mask layout representing a manufacturable mask
   f) generating second image contours which simulate an image printed on a wafer using said mask layout and said second process model;
   g) modifying said mask layout to form a modified mask layout based on step (e); and h) repeating steps (f) and (g) using said modified mask layout until said second image contours match said first image contours within manufacturability tolerances.

2. The method of claim 1, wherein said first process model comprises a process window model and said first image contours comprise a band of contours corresponding to a range of process conditions.

3. The method of claim 1, wherein step (e) includes using resolution enhancement technology to generate said mask layout.

4. The method of claim 1, wherein said second process model comprises a process window model.

5. The method of claim 1, wherein said second process model is more accurate than said first process model.

6. The method of claim 1, further comprising performing a tapeout comprising said first image contours and said modified design layout, and providing said tapeout as input to step (e).

7. The method of claim 1, further comprising building a mask in accordance with said modified mask layout.

8. A computer program product comprising a computer usable medium having computer readable program embodied in said medium for designing an integrated circuit, wherein the computer readable program when executed on a computer causes the computer to:
- a) providing one or more design tolerances, a design layout containing a set of intended design shapes, and a first process model then
- b) using said design layout and said first process model to generate first image contours which simulate an image printed on a wafer;
- c) modifying said design layout to form a modified design layout based on step (b);
- d) repeating steps (b) and (c) using said modified design layout until said first image contours satisfy said one or more design tolerances;
- then e) using said modified design layout and a second process model, different from the first process model and which corrects for optical proximity, to generate a mask layout representing a manufacturable mask
- f) generating second image contours which simulate an image printed on a wafer using said mask layout and said second process model;
- g) modifying said mask layout to form a modified mask layout based on step (e); and h) repeating steps (f) and (g) using said modified mask layout until said second image contours match said first image contours within manufacturability tolerances.

9. The computer program product of claim 8, wherein said first process model comprises a process window model and said first image contours comprise a band of contours corresponding to a range of process conditions.

10. The computer program product of claim 8, wherein step (e) includes using resolution enhancement technology to generate said mask layout.

11. The computer program product of claim 8, wherein said second process model comprises a process window model.

12. The computer program product of claim 8, wherein said second process model is more accurate than said first process model.

13. The computer program product of claim 8, wherein said first process model is a compact process model.

14. A method of providing a computer implemented service for designing an integrated circuit, the service comprising:
- a) providing one or more design tolerances, a design layout containing a set of intended design shapes, and a first process model then
- b) using said design layout and said first process model to generate first image contours which simulate an image printed on a wafer;
- c) modifying said design layout by computer to form a modified design layout based on step (b);
- d) repeating steps (b) and (c) using said modified design layout until said first image contours satisfy said one or more design tolerances;
- then e) using said modified design layout and a second process model, different from the first process model and which corrects for optical proximity, to generate a mask layout representing a manufacturable mask
- f) generating second image contours which simulate an image printed on a wafer using said mask layout and said second process model;
- g) modifying said mask layout to form a modified mask layout based on step (e); and
- h) repeating steps (f) and (g) using said modified mask layout until said second image contours match said first image contours within manufacturability tolerances.

15. The service of claim 14, wherein said first process model comprises a process window model and said first image contours comprise a band of contours corresponding to a range of process conditions.

16. The service of claim 14, wherein said step of modifying said first modified layout comprises performing optical proximity correction.

17. The service of claim 14, wherein step (e) includes using resolution enhancement technology to generate said mask layout.

18. The service of claim 14, wherein said second process model comprises a process window model.

19. The service of claim 14, wherein said second process model is more accurate than said first process model.

20. The service of claim 14, where in said first process model is a compact process model.

21. The service of claim 14, further comprising performing a tapeout comprising said first image contours and said modified design layout, and providing said tapeout as input to step (e).

* * * * *